(12) United States Patent
Lou et al.

(10) Patent No.: US 11,895,859 B2
(45) Date of Patent: Feb. 6, 2024

(54) TRANSPARENT DISPLAY PANELS, DISPLAY SCREENS, AND MASK PLATES

(71) Applicant: KUNSHAN GO-VISIONOX OPTO-ELECTRONICS CO., LTD., Kunshan (CN)

(72) Inventors: Junhui Lou, Kunshan (CN); Lu Zhang, Kunshan (CN); Xiaoyang Tong, Kunshan (CN); Miao Chang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 534 days.

(21) Appl. No.: 17/242,233

(22) Filed: Apr. 27, 2021

(65) Prior Publication Data
US 2021/0249624 A1   Aug. 12, 2021

Related U.S. Application Data

(63) Continuation of application No. PCT/CN2019/107919, filed on Sep. 25, 2019.

(30) Foreign Application Priority Data

Mar. 29, 2019 (CN) .......................... 201910252177.3

(51) Int. Cl.
*H10K 50/813* (2023.01)
*H10K 50/844* (2023.01)
(Continued)

(52) U.S. Cl.
CPC ......... *H10K 50/813* (2023.02); *H10K 50/844* (2023.02); *H10K 59/122* (2023.02);
(Continued)

(58) Field of Classification Search
CPC ............... H10K 50/813; H10K 59/122; H10K 2102/3031; H10K 50/824; H10K 2102/351
See application file for complete search history.

(56) References Cited

U.S. PATENT DOCUMENTS 7,554,067 B2   6/2009   Zarnowski et al.
9,691,996 B2   6/2017   Lee
(Continued)

FOREIGN PATENT DOCUMENTS

CN   101170124 A   4/2008
CN   101641962 A   2/2010
(Continued)

OTHER PUBLICATIONS

Supplementary European Search Report of EP 19923265.3.
(Continued)

*Primary Examiner* — Mark W Tornow
(74) *Attorney, Agent, or Firm* — KILPATRICK TOWNSEND & STOCKTON LLP

(57) ABSTRACT

A transparent display panel, including a substrate, a first electrode layer disposed on the substrate, a light-emitting structure layer disposed on the first electrode layer, and a second electrode layer disposed on the light-emitting structure layer; the first electrode layer includes a plurality of first electrode groups arranged along a first direction; each of the first electrode groups includes at least one first electrode extending along a second direction, the second direction intersects with the first direction; each of the at least one first electrode includes at least two first electrode blocks and at least one connecting part, and two adjacent first electrode blocks are electrically connected with each other by a corresponding connecting part.

20 Claims, 8 Drawing Sheets

(51) Int. Cl.
*H10K 59/122* (2023.01)
*H10K 59/173* (2023.01)
*H10K 71/00* (2023.01)
*H10K 50/828* (2023.01)
*H10K 102/10* (2023.01)
*H10K 102/00* (2023.01)

(52) U.S. Cl.
CPC ........... *H10K 59/173* (2023.02); *H10K 71/00* (2023.02); *H10K 50/828* (2023.02); *H10K 2102/102* (2023.02); *H10K 2102/103* (2023.02); *H10K 2102/3031* (2023.02)

(56) References Cited

U.S. PATENT DOCUMENTS

| | | | |
|---|---|---|---|
| 11,282,903 | B2 | 3/2022 | Hong et al. |
| 2008/0100209 | A1 | 5/2008 | Ito et al. |
| 2008/0157663 | A1* | 7/2008 | Sung .................. H10K 50/828 |
| | | | 445/24 |
| 2010/0141612 | A1 | 6/2010 | Desieres et al. |
| 2011/0163318 | A1 | 7/2011 | Park et al. |
| 2011/0309385 | A1 | 12/2011 | Nendai |
| 2014/0061595 | A1* | 3/2014 | Kim .................... H10K 50/852 |
| | | | 438/23 |
| 2014/0313176 | A1 | 10/2014 | Kim et al. |
| 2014/0346444 | A1* | 11/2014 | Chung ................ H10K 50/813 |
| | | | 438/34 |
| 2016/0104760 | A1 | 4/2016 | Maeda |
| 2019/0074471 | A1 | 3/2019 | Abe et al. |
| 2019/0326366 | A1 | 10/2019 | Fan et al. |
| 2020/0075697 | A1 | 3/2020 | Xu et al. |
| 2020/0161390 | A1* | 5/2020 | Teramoto ............ H10K 50/856 |
| 2020/0273932 | A1 | 8/2020 | Liu |
| 2020/0303472 | A1* | 9/2020 | Lou .................... H10K 50/844 |

FOREIGN PATENT DOCUMENTS

| | | |
|---|---|---|
| CN | 102334385 A | 1/2012 |
| CN | 102809866 A | 12/2012 |
| CN | 105514138 A | 4/2016 |
| CN | 107123743 A | 9/2017 |
| CN | 107768545 A | 3/2018 |
| CN | 108269840 A | 7/2018 |
| CN | 207947007 U | 10/2018 |
| CN | 108873502 A | 11/2018 |
| CN | 109192076 A | 1/2019 |
| CN | 109273512 A | 1/2019 |
| CN | 208507679 U | 2/2019 |
| CN | 208622778 U | 3/2019 |
| CN | 208622781 U | 3/2019 |
| CN | 110911440 A | 3/2020 |
| JP | 2001217081 A | 8/2001 |
| JP | 2001313182 A | 11/2001 |
| JP | 2002299607 A | 10/2002 |
| JP | 2007248674 A | 9/2007 |
| JP | 2010020971 A | 1/2010 |
| JP | 2010230797 A | 10/2010 |
| JP | 2012033307 A | 2/2012 |
| JP | 2014154211 A | 8/2014 |
| KR | 10-2016-0101825 A | 8/2016 |
| KR | 10-2017-0123379 A | 11/2017 |
| TW | 201835665 A | 10/2018 |
| WO | 2016143046 A1 | 9/2016 |
| WO | 2017131143 A1 | 8/2017 |
| WO | 2017195560 A1 | 11/2017 |
| WO | 2020052192 A1 | 3/2020 |
| WO | 2020088021 A1 | 5/2020 |

OTHER PUBLICATIONS

Notice of Allowance of Chinese Patent Application No. 201910252177.3.
International Search Report of International Application No. PCT/CN2019/107919.
Office Actions of Chinese Patent Application No. 201910252177.3.
Notice of Decision to Grant Patent of KR Patent Application No. 10-2021-7017575 dated Jun. 19, 2023.
Office Action of JP Patent Application No. 2021-532986 dated Jun. 6, 2023.
Office Action of EP Patent Application No. 19923265.3 dated Nov. 7, 2022.
Office Action of JP Patent Application No. 2021-532986 dated Aug. 2, 2022.
1 Office Action of EP Patent Application No. 19923265.3 dated May 8, 2023.

* cited by examiner

TRANSPARENT DISPLAY PANELS, DISPLAY SCREENS, AND MASK PLATES

CROSS-REFERENCE TO RELATED APPLICATIONS

This application is a continuation application of International Application PCT/CN2019/107919, filed on Sep. 25, 2019, which claims priority to Chinese Patent Application No. 201910252177.3, filed on Mar. 29, 2019, and the disclosure of both applications are hereby incorporated by reference in their entireties.

TECHNICAL FIELD

The present application relates to a field of display technology.

SUMMARY

Embodiments of the present application provide a transparent display panel, which includes a substrate, a first electrode layer disposed on the substrate, a light emitting structure layer disposed on the first electrode layer, and a second electrode layer disposed on the light emitting structure layer; the first electrode layer includes a plurality of first electrode groups arranged along a first direction. Each of the first electrode groups includes at least one first electrode extending along a second direction intersecting the first direction. Each of the at least one first electrode includes at least two first electrode blocks and at least one connecting portion. Two adjacent first electrode blocks are electrically connected with each other by a corresponding connecting portion.

Embodiments of the present application provide a display screen, which includes a first display area and a second display area. The first display area is provided with the transparent display panel described above. A light transmittance of the first display area is greater than a light transmittance of the second display area. A photosensitive device is disposed under the first display area.

Embodiments of the present application provide a mask plate. The mask plate is used in a manufacturing process of the display screen described above.

A first pixel defining layer provided with first pixel openings is disposed on the first electrode layer; light emitting structure blocks are disposed in the first pixel openings; the second electrode layer is a surface electrode; the second electrode layer is disposed on the first pixel defining layer, and is partially disposed on side walls of the first pixel openings.

The first display area is further provided with a third electrode layer. The third electrode layer is disposed on an upper surface or a lower surface of the second electrode layer. The third electrode layer is in direct contact with the second electrode layer.

The second display area is further provided with a fourth electrode layer, a second pixel defining layer disposed on the fourth electrode layer and provided with a second pixel opening, a light emitting structure block provided in the second pixel opening, and a fifth electrode layer disposed on the second pixel defining layer. The fifth electrode layer is a surface electrode. A thickness of the fifth electrode layer is greater than a thickness of the second electrode layer. The mask plate includes a first opening configured to manufacture the fifth electrode layer, and a plurality of second openings configured to manufacture the third electrode layer.

In the transparent display panel, the display screen and the mask plate provided by the embodiments of the present application, since among the at least two first electrode blocks included in the same first electrode of the transparent display panel, two adjacent first electrode blocks are connected with each other by the corresponding connecting portion, the first electrode blocks of the first electrode can be driven by the same pixel driving circuit, only when one first electrode block of the first electrode is electrically connected to the corresponding pixel driving circuit, thus reducing the complexity of the wirings in the transparent display panel, effectively improving a diffraction superposition phenomenon caused by the complex wirings in the transparent display panel during light transmission, further improving the quality of the images captured by the camera disposed on the backlight surface of the transparent display panel, and avoiding the defects of image distortions. In addition, the plurality of first electrode blocks of the same first electrode are electrically connected with each other, such that the light emitting structure blocks correspondingly disposed on the plurality of first electrode blocks of the same first electrode can be controlled to emit light or be turned off simultaneously, thus simplifying a control for the transparent display panel.

During manufacturing the display screen, when the mask plate of the embodiment of the present application is used, the first opening is aligned with the second display area of the display screen, and the fifth electrode layer of the second display area is manufactured through the first opening. The second opening is aligned with the side wall of the first pixel defining layer of the first display area in the display screen, and the third electrode layer of the first display area is manufactured through the second opening. It can be seen that the fifth electrode layer of the second display area and the third electrode layer of the first display area can be manufactured at the same time by means of the above mask plate, thereby simplifying the manufacturing process of the display screen.

DETAILED DESCRIPTION OF THE EMBODIMENTS

Figure 1:
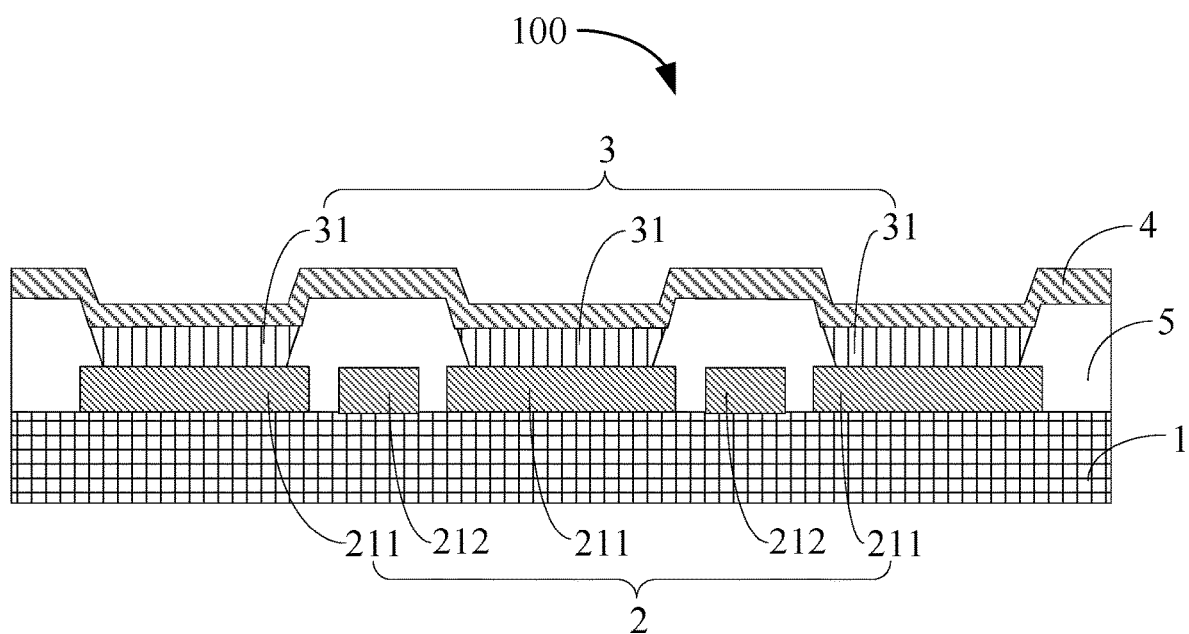
FIG. 1 is a cross-sectional view of a transparent display panel according to an embodiment of the present application.

With a rapid development of electronic devices, users have higher and higher requirements for a screen-to-body ratio, such that a full-screen display of an electronic device attracts more and more attention in the industry. As for a related electronic device such as a mobile phone, a tablet computer, or the like, due to a need to integrate a front-facing camera, an earpiece, an infrared sensor and the like, a notch can be disposed on a display screen thereof, and the camera, the earpiece, the infrared sensor and the like are disposed in the notched area. However, pictures cannot be displayed in the notched area like a notched screen. Alternatively, a hole can be disposed on the screen thereof, and for the electronic device that realizes a camera function, external light can enter into a photosensitive element disposed under the screen through the hole on the screen. However, the electronic device is not full-screen indeed, and cannot display in all areas of the entire screen, for example, pictures cannot be displayed in an area where the cameras are disposed.

Exemplary embodiments will be described in detail herein, and examples thereof are shown in accompanying drawings. When the following description refers to the accompanying drawings, unless otherwise indicated, a same reference numeral in different drawings indicates the same element or similar elements. Embodiments described in the following illustrative examples do not represent all embodiments consistent with the present application. On the contrary, they are merely examples of devices consistent with some aspects of the present application as detailed in appended claims.

In a smart electronic device such as a mobile phone, a tablet computer, or the like, due to a need to integrate photosensitive devices such as a front-facing camera, a light sensor and the like, a transparent display screen is generally provided on the above electronic device to achieve full-screen display of the electronic device.

However, after the light passes through the transparent display screen, the quality of light collected by the camera is poor, and even defects of image distortions may occur in a process of image acquisition. By means of research, the inventors found that a reason for this problem is that wirings in the transparent display screen of the electronic device is relatively complicated. When external light passes through the transparent display screen, a more complex diffraction intensity distribution will occur, thus resulting in diffraction fringes, and further affecting a normal operation of the photosensitive device. For example, when the camera under the transparent display area operates, and when the external light passes through the wirings disposed in the display screen, more obvious diffraction occurs at a boundary between different wirings, which causes distortions of the picture captured by the camera.

In order to solve the above problems, embodiments of the present application provide a transparent display panel, a display screen, a display device, and a mask plate, which can well solve the above problems.

The transparent display panel, the display screen, and the display device in the embodiments of the present application will be described in detail below with reference to the accompanying drawings. If there is no conflict, the embodiments and features in implementations described below can be complementary to each other or be combined with each other.

Referring to FIG. 1, a transparent display panel 100 provided by the embodiments of the present application includes a substrate 1, a first electrode layer 2 disposed on the substrate 1, a light emitting structure layer 3 disposed on the first electrode layer 2, and a second electrode layer 4 disposed on the light emitting structure layer 3.

Referring to FIGS. 2 to 6, the first electrode layer 2 includes a plurality of first electrode groups 20 arranged along a first direction. Each of the first electrode groups 20 includes at least one first electrode 21 extending along a second direction. The second direction intersects the first direction. Each of the at least one first electrode 21 includes at least two first electrode blocks 211 and at least one connecting portion 212. Two adjacent first electrode blocks 211 are electrically connected with each other by a corresponding connecting portion 212.

The light emitting structure layer 3 includes a plurality of light emitting structure blocks 31. The plurality of light emitting structure blocks 31 are disposed on the plurality of first electrode blocks 211, and are in a one-to-one correspondence with the plurality of first electrode blocks.

In the transparent display panel 100 provided by the embodiments of the present application, since among the at least two first electrode blocks 211 included in the same first electrode 21, two adjacent first electrode blocks 211 are connected with each other by the corresponding connecting portion 212, the first electrode blocks 211 of the first electrode 21 can be driven by a same pixel circuit, and only one of the first electrode blocks 211 of the first electrode 21 is required to be electrically connected to the corresponding pixel driving circuit, thus reducing the complexity of the wirings in the transparent display panel, effectively improving a diffraction superposition phenomenon caused by the complex wirings in the transparent display panel during light transmission, further improving the quality of the images captured by the camera disposed on a backlight surface of the transparent display panel, and avoiding the defects of image distortions. In addition, the plurality of first electrode blocks 211 of the same first electrode 21 are electrically connected with each other, such that the light emitting structure blocks correspondingly disposed on the plurality of first electrode blocks 211 of the same first electrode 21 can be controlled to emit light or be turned off simultaneously, thus simplifying a control for the transparent display panel.

In an embodiment, the transparent display panel 100 can further include a first pixel defining layer 5 disposed on the first electrode layer 2. A plurality of first pixel openings are arranged at intervals on the first pixel defining layer 5. The plurality of light emitting structure blocks 31 of the light emitting structure layer 3 are disposed in the plurality of first pixel openings, and are in a one-to-one correspondence with the plurality of first pixel openings.

In an embodiment, the first electrode layer 2 can be an anode layer. The second electrode layer 4 can be a cathode layer. The second electrode layer 4 can be a surface electrode, that is, the second electrode layer 4 is a continuous electrode area.

In an embodiment, the at least two first electrode blocks 211 and the at least one connecting portion 212 of the first electrode group 20 are disposed on the same layer. In such a case, the first electrode blocks 211 and the connecting portions 212 in the first electrode group 20 can be formed in a same process step, thus reducing the complexity of the manufacturing processes.

Further, when the first electrode blocks 211 and the connecting portions 212 of the first electrode group 20 are arranged on the same layer, a size of the connecting portion 212, in a direction perpendicular to an extension direction of the connecting portion 212, is greater than 3 µm and smaller than a half of a maximum size of the first electrode block 211. The size of the connecting portion, in a direction perpendicular to the extension direction thereof, is configured to be greater than 3 µm, thus making a resistance of the connecting portion 212 smaller. The size of the connecting portion 212 is configured to be smaller than a half of the maximum size of the first electrode block 211, thus making the connecting portion 212 have a little effect on the size of the first electrode block 211, preventing an effective light emitting area of the transparent display panel 100 from being reduced due to a reduced size of the first electrode block 211, which is caused by a larger size of the connecting portion 212.

In another embodiment, the first electrode blocks 211 and the connecting portions 212 of the first electrode group 20 are provided on different layers. In such a case, the size of the first electrode block 211 is not be limited by the connecting portion 212, and the first electrode block 211 can be manufactured to have a larger size, thereby making the effective light emitting area of the transparent display panel 100 larger.

Figure 7:
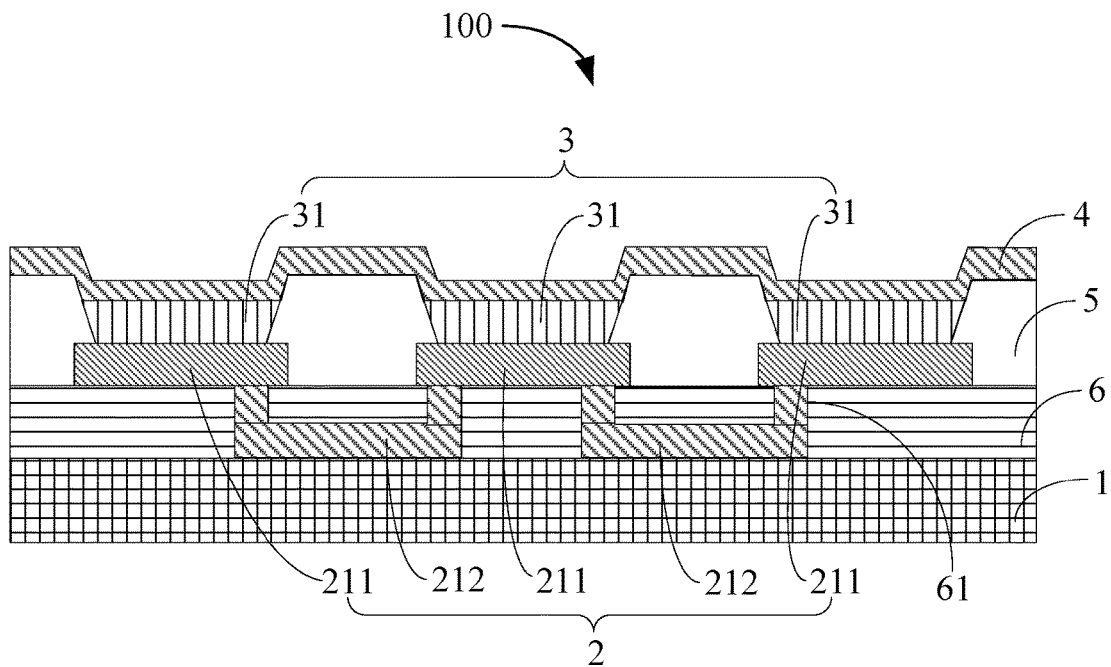
FIG. 7 is a cross-sectional view illustrating the transparent display panel according to another embodiment of the present application.

The connecting portion 212 can be disposed between the first electrode block 211 and the substrate 1. For example, referring to FIG. 7, an insulating layer 6 is disposed below the first electrode block 211, and the connecting portion 212 is disposed between the insulating layer 6 and the substrate 1.

Further, a contact hole 61 is arranged in the insulating layer 6 and disposed at a position under the first electrode block 211. The contact hole 61 is filled with a conductive material. The first electrode block 211 is electrically connected to the corresponding connecting portion 212 by the conductive material in the contact hole 61 disposed under the first electrode block 211. By means of providing the contact hole 61 in the insulating layer 6 and under the first electrode block 211, and filling the contact hole 61 with the conductive material, the first electrode block 211 is electrically connected to the corresponding connecting portion 212, thereby achieving the effect that the first electrode block 211 and the connecting portion 212 are provided on different layers.

In an embodiment, referring to FIGS. 2 to 6, a projection of the first electrode block 211 on the substrate 1 includes a first pattern unit or a plurality of first pattern units that are connected with each other. The first pattern unit can include circular, elliptical, dumbbell-shaped, gourd-shaped, or rectangular. In this case, a periodic structure generated by diffraction can be changed. That is, a distribution of diffraction field is changed, thereby reducing the diffraction effect generated when the external incident light passes through.

Figure 2:
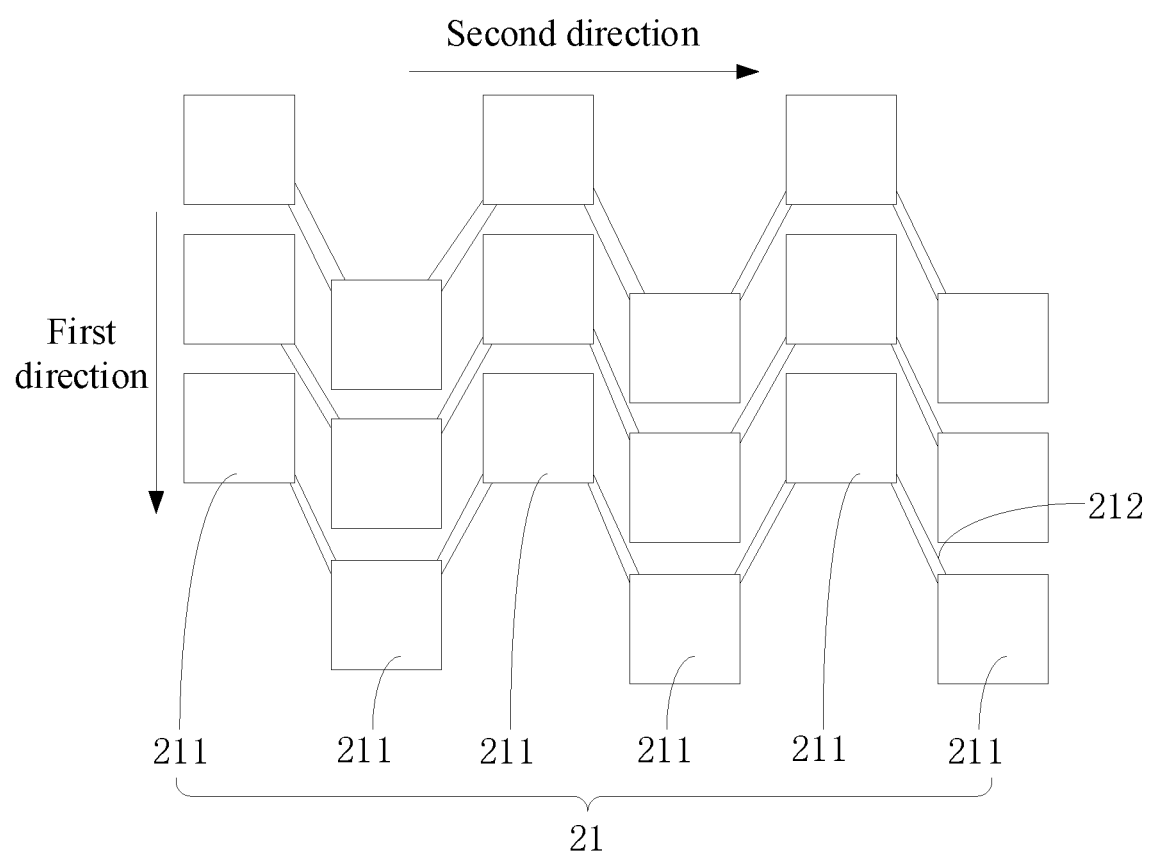
FIG. 2 is a schematic view of a projection of a first electrode layer of a transparent display panel on a substrate according to an embodiment of the present application.
Figure 3:
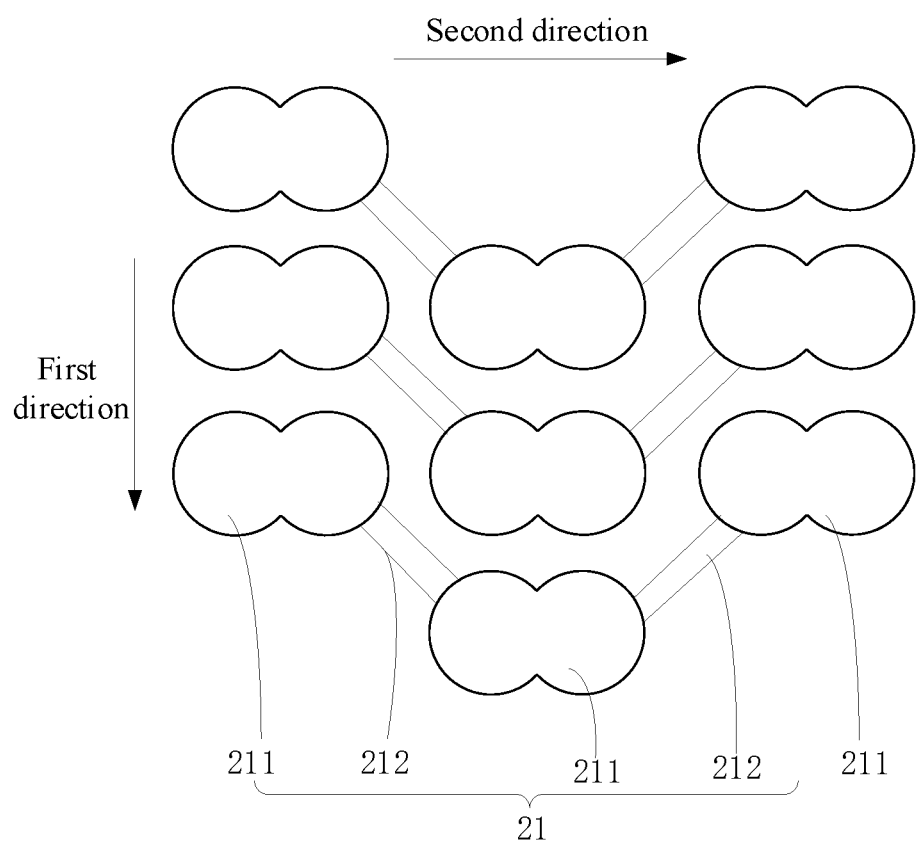
FIG. 3 is a schematic view of a projection of the first electrode layer of the transparent display panel on the substrate according to another embodiment of the present application.
Figure 4:
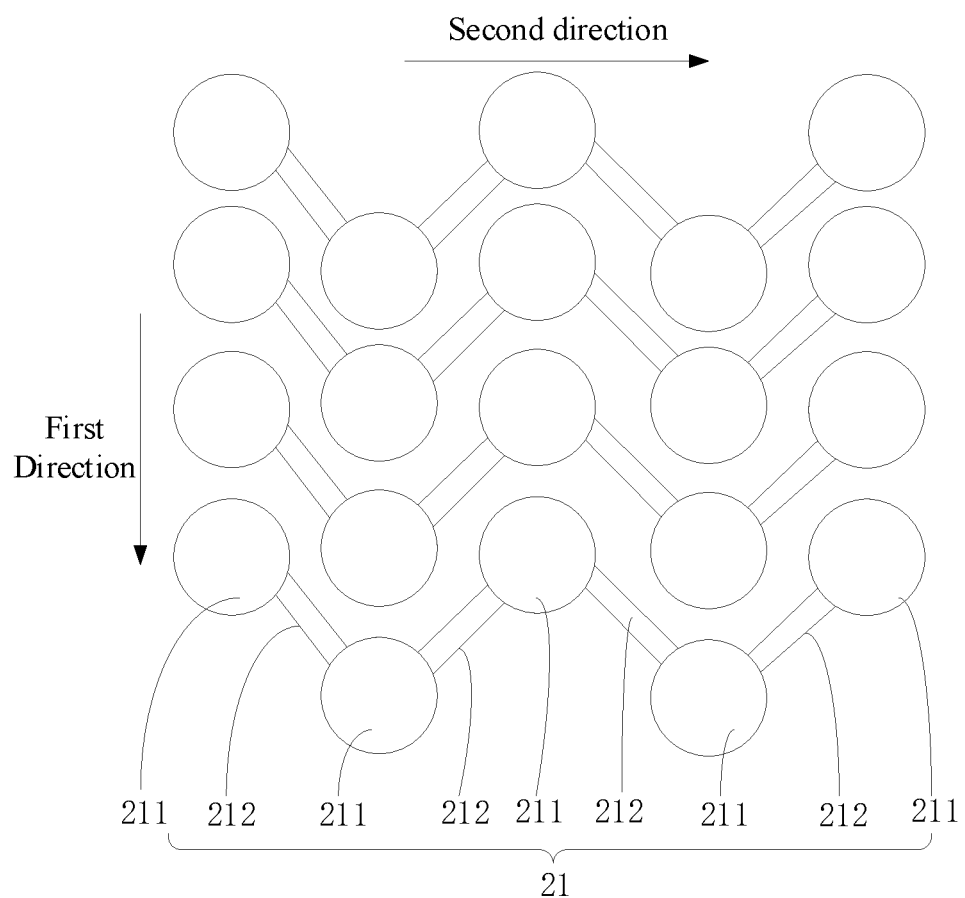
FIG. 4 is a schematic view of a projection of the first electrode layer of the transparent display panel on the substrate according to another embodiment of the present application.
Figure 5:
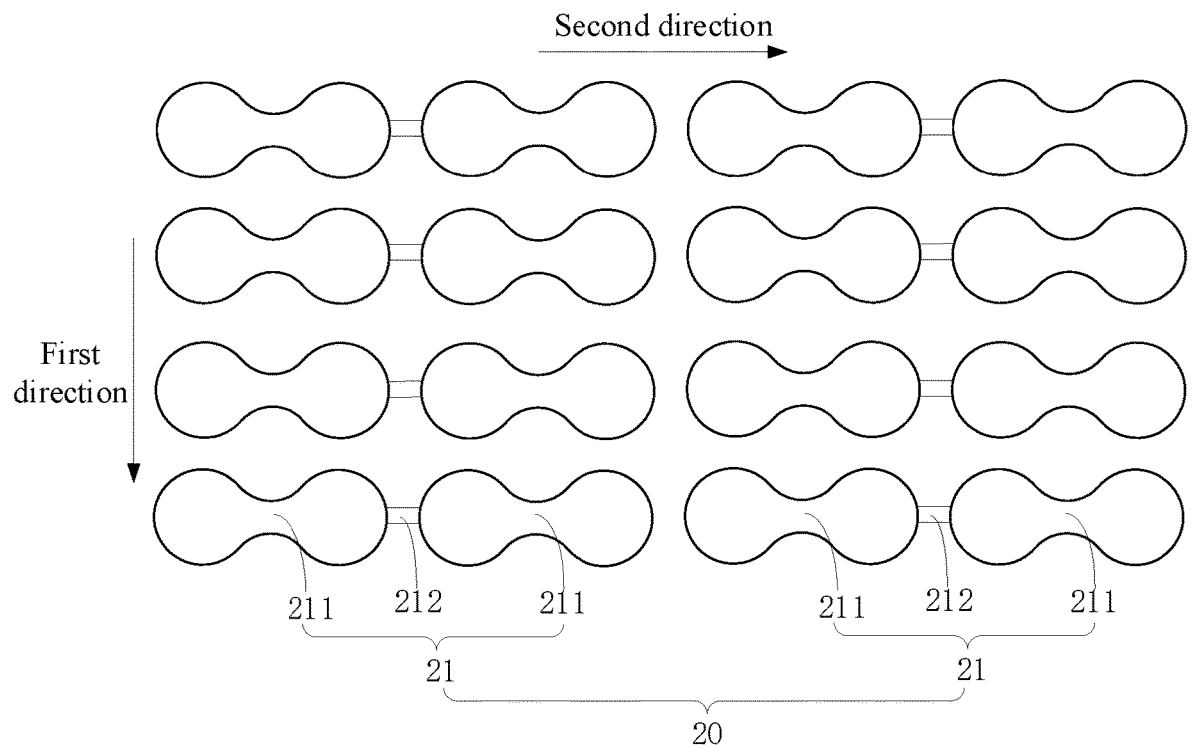
FIG. 5 is a schematic view of a projection of the first electrode layer of the transparent display panel on the substrate according to another embodiment of the present application.
Figure 6:
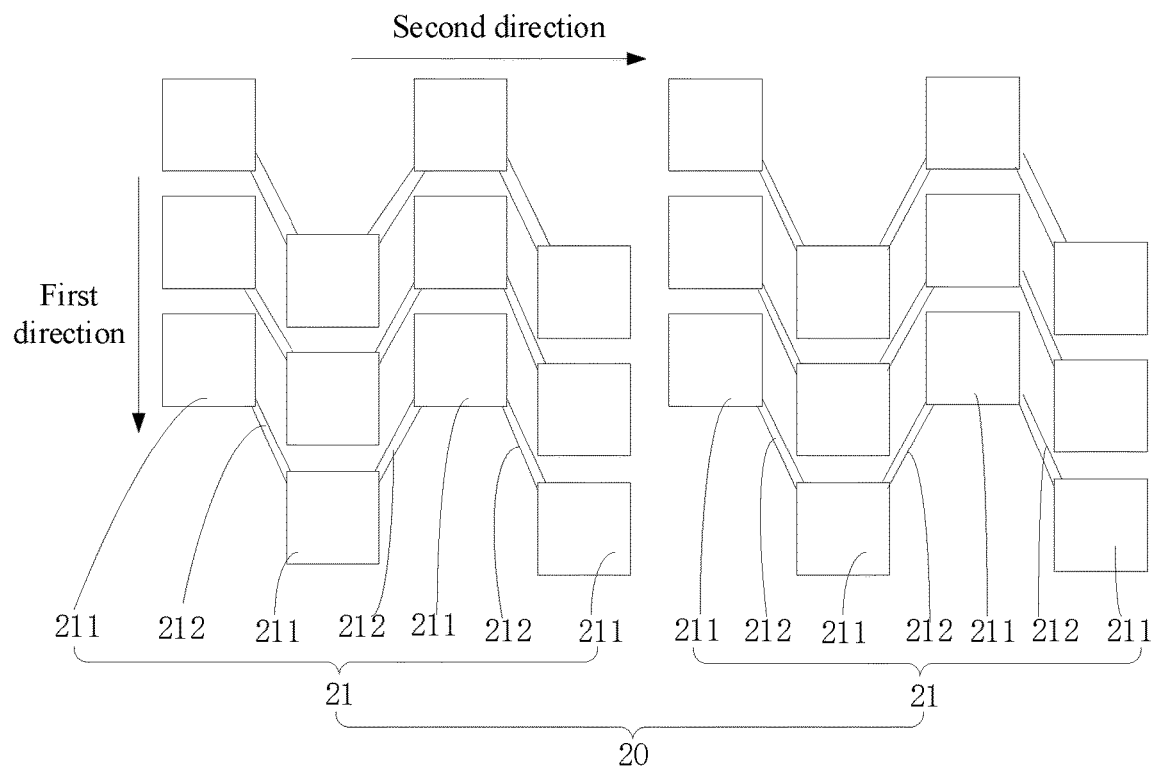
FIG. 6 is a schematic view of a projection of the first electrode layer of the transparent display panel on the substrate according to yet another embodiment of the present application.

Referring to FIG. 2, in an embodiment, each of the first electrode groups 20 includes one first electrode 21. Each first electrode 21 includes six electrode blocks 211. A projection of each of the first electrode blocks 211 on the substrate includes one first pattern unit. The first pattern unit is rectangular. Referring to FIG. 3, in another embodiment, each of the first electrode groups 20 includes one first electrode 21. Each first electrode 21 includes three first electrode blocks 211. A projection of each of the first electrode blocks 211 on the substrate includes one first pattern unit. The first pattern unit is gourd-shaped. Referring to FIG. 4, in another embodiment, each of the first electrode groups 20 includes one first electrode 21. Each first electrode 21 includes five first electrode blocks 211. A projection of each of the first electrode blocks 211 on the substrate includes one first pattern unit. The first pattern unit is circular. Referring to FIG. 5, in another embodiment, each of the first electrode groups 20 includes two first electrodes 21. Each of the first electrodes 21 includes two first electrode blocks 211. A projection of the electrode block 211 on the substrate includes one first pattern unit. The first pattern unit dumbbell-shaped. Referring to FIG. 6, in another embodiment, each of the first electrode groups 20 includes two first electrodes 21. Each of the first electrodes 21 includes four first electrode blocks 211. A projection of the first electrode block 211 on the substrate includes one first pattern unit. The first pattern unit is rectangular. The first pattern unit is circular, elliptical, dumbbell-shaped, or gourd-shape, and in this case, the size of the first electrode 21 in the first direction changes continuously or intermittently, and a distance between two adjacent first electrodes 21 in the first direction changes continuously or intermittently, thus positions of diffraction generated by two adjacent first electrodes 21 are different. The diffraction effects at different positions are countered, so that the diffraction effects can be effectively reduced, and it is ensured that the images captured by the camera disposed under the transparent display panel 100 has higher definition.

In an embodiment, a projection of the light emitting structure block 31 correspondingly disposed on each of the first electrode blocks 211 on the substrate 1 includes a second pattern unit or a plurality of second pattern units that are connected with each other. The second pattern unit includes circular, elliptical, dumbbell-shaped, gourd-shaped, or rectangular. The second pattern unit is identical with the first pattern unit or not. In this case, the periodic structure generated by the diffraction can be changed. That is, the distribution of the diffraction field is changed, thereby reducing the diffraction effects generated when the external incident light passes through. Optionally, the projection of the first electrode block 211 correspondingly disposed on the light emitting structure block 31 on the substrate 1 is different from the projection of the first electrode block 211 on the substrate 1. For example, the positions of the projections do not completely overlap, shapes of the projections are different, or sizes of the projections are different, so as to further reduce the diffraction effects generated by the light passing through the transparent display panel 100.

In an embodiment, the first direction is perpendicular to the second direction. The first direction is a row direction or a column direction. The plurality of first electrodes 21 can be arranged in one row and multiple columns, or in one column and multiple rows, or in two columns and multiple rows, or in two rows and multiple columns, or in multiple rows and multiple columns. FIGS. 2 to 6 illustrate embodiments only by taking the first direction being the column direction and the second direction being the row direction as examples. In other embodiments, the first direction can also be the row direction, and the second direction can be the column direction.

In an embodiment, referring to FIGS. 2, 3, 4, and 6, in the second direction, in the at least two first electrode blocks of the same first electrode group, two projections of two adjacent first electrode blocks on a plane perpendicular to the second direction are offset. Such an arrangement can make the diffraction effect generated by the external incident light passing through the transparent display panel 100 to be further reduced.

Further, a distance between central axes in the first direction of two adjacent first electrode blocks 211 among the plurality of first electrode blocks 211 of the same first electrode group 20 and in the second direction can be 0.5 times or 1.5 times the size in the second direction of the first electrode block 211. In other embodiments, the distance between the central axes in the first direction of two adjacent first electrode blocks 211 can also be 1.0 times or 0.8 times the size in the second direction of the block electrodes 211.

Further, the first electrode 21 includes at least three first electrode blocks 211. In the first electrode blocks of the same first electrode, two projections of two first electrode blocks located at two sides of any one of the at least three first electrode blocks on a plane perpendicular to the second direction are overlapped completely. Such an arrangement makes the plurality of first electrode blocks 211 of the first electrode group 20 to be arranged more regularly, so that the light emitting structure blocks 31 correspondingly disposed on the plurality of first electrode blocks 211 are arranged more regularly, and thus openings of a mask plate that is used to manufacture the light emitting structure blocks 31 are arranged more regularly. In addition, when the light emitting structure blocks of a composite display screen including the transparent display panel and a conventional non-transparent display panel is being manufactured by evaporation, the same mask plate can be used in the same evaporation process. Since patterns on the mask plate are relatively uniform, wrinkles of a net are also reduced.

In order to increase light transmittance of the transparent display panel 100, a material of each layer of the transparent display panel 100 can be a transparent material. In this case, the light collecting effect of a photosensitive device, such as a camera, disposed under the transparent display panel 100 can be improved.

In an embodiment, materials of the first electrode layer 2 and/or the second electrode layer 4 are transparent materials.

Further, a light transmittance of the transparent material of the first electrode layer 2 and/or the second electrode layer 4 can be greater than or equal to 70%. Optionally, the light transmittance of the transparent material is greater than or equal to 90%. For example, the light transmittance of the transparent material can be 90%, 95%, or the like. Such an arrangement can make the light transmittance of the transparent display panel 100 larger, thus enabling the light transmittance of the transparent display panel 100 to meet light collecting requirements of the photosensitive device disposed under the transparent display panel 100.

Further, the transparent material of the first electrode layer 2 and/or the second electrode layer 4 can include at least one of indium tin oxide, indium zinc oxide, silver-doped indium tin oxide, and silver-doped indium zinc oxide. Optionally, the transparent material for manufacturing the first electrode layer 2 and/or the second electrode layer 4 is silver-doped indium tin oxide or silver-doped indium zinc oxide, thereby reducing the resistance of the first electrode layer 2 and/or the second electrode layer 4, while ensuring higher light transmittance of the transparent display panel 100.

In an embodiment, the transparent display panel 100 has a plurality of euphotic paths. Each path passes or goes through different film layers. The external incident light enters into the transparent display panel 100 in a direction perpendicular to a surface of the substrate 1. When a thickness of a film layer is set to be a preset thickness, and/or when a refractive index of a film layer is set to a preset refractive index, the external incident light passes through the transparent display panel 100 along any two of the plurality of paths to obtain a difference between the optical path lengths of the two paths, and the difference therebetween is an integer multiple of a wavelength of the external incident light.

Since the difference between the two paths in the length is an integer multiple of the wavelength of the light, when two beams of lights are respectively emitted from the two paths of the transparent display panel 100, a phase difference of the two beams of light is zero. An important reason for diffraction is that the phase difference is generated after the beams of light with the same phase pass through the display, therefore, if the phases of the beams of light remain the same after the beams of light with the same phase pass through the two paths of the display panel then no phase difference occurs, thus eliminating the diffraction phenomenon caused by the phase difference, avoiding image distortions caused by diffraction of the beams of light passing through the transparent display panel 100, improving the definition of the images captured by the camera disposed under the transparent display panel 100, and enabling the photosensitive element disposed under the transparent display panel to acquire clear and real images.

The plurality of paths, such as three, four, or five paths, can be disposed in the transparent display panel 100. The difference between the optical path lengths of any two of the plurality of paths is an integer multiple of the wavelength of the incident light. In this case, the diffraction of the beams of light passing through these paths of the transparent display panel 100 can be effectively reduced. The more paths that satisfy such a condition are, the weaker the diffraction phenomenon of the beams of light passing through the transparent display panel 100 is. In this case, the phase difference of the beams of light caused by the difference of the phases after the beams of light pass through the transparent display panel 100 can be basically eliminated, thereby greatly reducing the occurrence of diffraction phenomenon.

The optical path length is equal to the refractive index of a medium multiplied by the distance the light travels in the medium, namely, the optical path length is a product of the refractive index of the medium and the distance the light travels in the medium. When the external incident light passes through each film layer of the transparent display panel 100, a calculation equation of the optical path length is as follows:

$$L = d1*n1 + d2*n2 + \ldots + di*ni$$

Where L is the optical path length, i is the number of the film layers through which the path of the external incident light passes; d1, d2, . . . , di are respective thicknesses of the film layers through which the path of the external incident light passes; n1, n2, . . . , ni are the respective refractive index of the film layers through which the path of the external incident light passes.

Optionally, the difference between the optical path lengths of the two paths is 0. That is, the difference between La and Lb is 0. That is, the optical path lengths of the two paths are 0. Compared with adjusting the thickness and the refractive index of each film layer to make the difference between optical path lengths of the two paths be an integer multiple of the wavelength of the external incident light, adjusting the thickness and the refractive index of each film layer to make the difference between the optical path lengths of the two paths be zero is easily implemented and realized.

In an embodiment, the transparent display panel 100 further includes an encapsulating layer 7 disposed on the second electrode layer 4. The encapsulating layer 7 can be a layer of a hard screen encapsulation or an organic film encapsulation.

Figure 8:
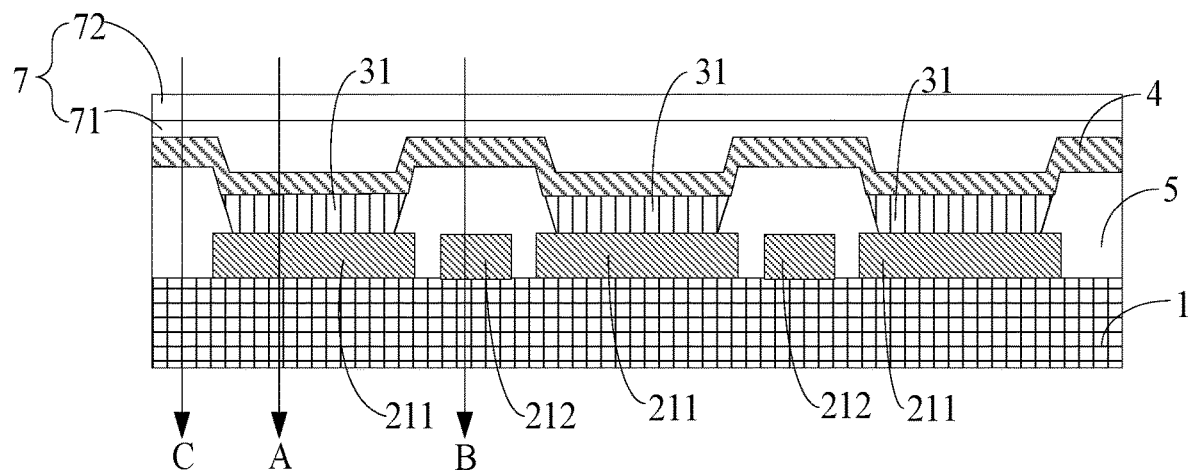
FIG. 8 is a schematic view illustrating the display panel shown in FIG. 1 through which light passes according to an embodiment of the present application.

When the encapsulating layer of the transparent display panel 100 is a layer of a hard screen encapsulation such as glass frit encapsulation, referring to FIG. 8, the encapsulating layer 7 includes a vacuum gap layer 71 and an encapsulating substrate 72. The encapsulating substrate 72 is, for example, a glass cover plate.

When the first electrode blocks 211 and the connecting portion 212 in the first electrode group 20 are arranged on the same layer, there are a plurality of paths in the transparent display panel 100. Since the transparent display panel 100 has two different modes, a top-emitting structure and a bottom-emitting structure, if the transparent display panel 100 has the top-emitting structure, the camera is disposed under the substrate 1. If the transparent display panel 100 has a bottom-emitting structure, the camera is disposed at a side of the encapsulating glass, and the side of the encapsulating glass is away from the second electrode layer 4.

Each of the film layers of the transparent display panel 100 shown in FIG. 8 will be analyzed as follows.

The substrate 1 can be a rigid substrate, for example a transparent substrate such as a glass substrate, a quartz substrate, or a plastic substrate. The substrate 1 can also be a flexible transparent substrate, such as a PI film, so as to improve the transparency of the device. Since all paths of light perpendicularly passing through a substrate are identical, the substrate 1 has no substantial influence on the differences between the optical path lengths of the different paths of light perpendicularly passing through the substrate.

In the transparent display panel shown in FIG. 8, the first electrode blocks 211 and the connecting portions 212 are disposed on the same layer and can be formed in the same process step, so the thicknesses and materials of the first electrode block 211 and the connecting portion 212 can be identical respectively. The first electrode block 211 and the connecting portion 212 can be made of a transparent conductive material, which generally can be indium tin oxide, indium zinc oxide, silver-doped indium tin oxide, or silver-doped indium zinc oxide. The thicknesses and the refractive indices of the first electrode block 211 and the connecting portion 212 can be adjusted. By adjusting the thickness or the refractive index, or adjusting both the thickness and the refractive index, the optical path length of the light passing through one path is adjusted, so that the difference between the optical path length of the path and the optical path length of any other path satisfies the above conditions. The thickness of the first electrode block 211 and the thickness of the connecting portion 212 are generally in a range from 20 nm to 200 nm. The thickness of the first electrode block 211 and the thickness of the connecting portion 212 can be adjusted within the above range. When the first electrode block 211 and the connecting portion 212 are formed in the same process step, the thicknesses and the refractive indices of the first electrode block 211 and the connecting portion 212 can only be adjusted at the same time.

The first electrode block 211 and the connecting portion 212 can also be formed in different process steps. The materials of the first electrode block 211 and the connecting portion 212 can be identical or different. Therefore, the thicknesses and the refractive indices of the first electrode block 211 and the connecting portion 212 can be adjusted respectively.

A thickness of the first pixel defining layer 5 is relatively large, and the adjustable range thereof is larger. Generally, the thickness of the first pixel defining layer 5 is in a range from 0.3 μm to 3 μm, and the thickness of the first pixel defining layer 5 can be adjusted within this range. Therefore, the thickness of the first pixel defining layer 5 can be adjusted to enable the optical path length to meet the above requirements. If the optical path length cannot meet the requirements by only adjusting the thickness of the first pixel defining layer 5, the materials of the first pixel defining layer 5 can also be adjusted, so as to cooperatively adjust the refractive index of the first pixel defining layer 5. It is also possible to adjust both the thickness and the refractive index of the first pixel defining layer 5, thereby adjusting the optical path length of the light passing through the path.

The light emitting structure layer 3 generally includes a light extraction layer, an electron injection layer, an electron transport layer, a hole blocking layer, a light emitting structure block 31, a hole transport layer, and a hole injection layer. Except the light emitting structure block 31, each of other layers including the light extraction layer, the electron injection layer, the electron transport layer, the hole blocking layer, the hole transport layer, the hole injection layer not shown in the figures is provided on an entire surface, and has no influence on the difference between the optical path lengths of the paths through which the light passes. The light emitting structure block 31 of the light emitting structure layer 3 is disposed inside the first pixel opening. The light emitting structure blocks 31 included in different light emitting sub-pixels are made of different materials, including red light emitting material, blue light emitting material and green light emitting material. For different light emitting sub-pixels, the optical path length of the light passing through the path can also be adjusted by adjusting the thickness or the refractive index of the light emitting structure block, or adjusting both the thickness and the refractive index of the light emitting structure block. Since the overall thickness of the light emitting structure block 31 is small, the adjustable range of the light emitting structure block 31 is small. In this case, other film layers can be adjusted to cooperatively adjust the optical path length, avoiding individual adjustment to make the optical path length meet the above requirements.

The second electrode layer 4 is disposed on an entire surface, so the second electrode layer 4 has no substantial influences on the difference between the optical path lengths of various paths through which the light passes.

The transparent display panel 100 shown in FIG. 8 is a hard screen encapsulated by glass frit (i.e. Frit encapsulation). The encapsulating layer 7 includes the low vacuum gap layer 71 and the encapsulating substrate 72. The vacuum gap layer 71 is filled with inert gas. The encapsulating substrate 72 is encapsulating glass.

Referring to FIG. 8 again, paths through which the light transmitting the transparent display panel 100 include a first path A, a second path B, and a third path C.

The first path A passes through the encapsulating layer 7, the second electrode layer 4, the light emitting structure layer 3, the first electrode block 211, and the substrate 1.

The second path B passes through the encapsulating layer 7, the second electrode layer 4, the first pixel defining layer 5, the connecting portion 212, and the substrate 1.

The third path C passes through the encapsulating layer 7, the second electrode layer 4, the first pixel defining layer 5 and the substrate 1.

A thickness of the vacuum gap layer 71 passed through by the first path A is greater than a thickness of the vacuum gap layer 71 passed through by other paths.

The optical path length of the light passing through the first path A is LA. The optical path length of the light passing through the second path B is LB. The optical path length of the light passing through the third path C is LC. By adjusting the thickness or the refractive index of the above one or more film layers, one or more of the differences between any two of LA, LB, and LC is an integer multiple of the wavelength.

Herein, taking LA, LB, and LC as examples, $LA-LB=X1 \cdot \lambda$; X1 is an integer; or $LB-LC=X2 \cdot \lambda$; X2 is an integer.

Of course, $LA-LB=X1 \cdot \lambda$ and $LB-LC=X2 \cdot \lambda$ both can be satisfied, where X1, X2 are integers, and can be a positive or negative integer or zero. In this case, it can be satisfied that the differences between the optical path lengths among the first path A, the second path B, and the third path C are an integer multiple of the wavelength of the light. That is, after the light passes through the three paths of the first path A, the second path B, and the third path C, the phase of the incident light is the same as the phase of the emitted light, thus greatly reducing the occurrence of diffraction.

For the optical path lengths LA, LB, and LC of different paths, the optical path length of each path can be calculated by measuring the thickness and the refractive index of each film layer.

In order to meet the requirements of the above difference between the optical path lengths by adjusting the film layers in the path, it is necessary to determine which film layer in the same layer affects the optical path length. Although each path passes through many layers, during calculating the difference between the optical path lengths, if all paths pass through a same film layer, as the material and thickness of the film layer are respectively the same, the difference between the optical path lengths of two paths will not be affected. Only film layers of different materials, or film layers of the same material but different thicknesses, will affect the difference between optical path lengths.

Specifically, as for the first path A, the second path B, and the third path C, the first path A includes the light emitting structure layer 3, while the second path B and the third path C do not include the light emitting structure layer 3. The difference between the optical path length of the first path A and the optical path length of the second path B or the third path C can be adjusted by adjusting the thickness and/or the refractive index of the light emitting structure layer 3.

For the first path A and the second path B, the substrate 1, the encapsulating substrate 72, and the second electrode layer 4 are made of the same material and have the same thickness, and need not be considered. When the connecting portion 212 and the first electrode block 211 are formed in the same process step, they have the same thickness, and need not be considered. The different film layers between the first path A and the second path B are the vacuum gap layer 71 (located in both the first path A and the second path B but with different thicknesses), the first pixel defining layer 5 (in the second path B), and the light emitting structure layer 3 (in the first path A). Since a sum of the thickness of the vacuum gap layer 71 and the thickness of the light emitting structure blocks 31 of the light emitting structure layer 3 in the first path A is the same as a sum of the thickness of the vacuum gap layer 71 and the thickness of the first pixel defining layer 5 passed through by the second path B, when the thickness of the first pixel defining layer 5 is adjusted, the difference between the thickness of the vacuum gap layer 71 passed through by the first path A and the thickness of the vacuum gap layer 71 passed through by the second path B will be adjusted accordingly. It can be seen that the main film layers that affect the first path A and the second path B are the first pixel defining layer 5 and the light emitting structure layer 3. By adjusting the thickness and/or the refractive index of the first pixel defining layer 5, the difference between the optical path length of the path A and the optical path length of the path B can be an integer multiple of the wavelength. Of course, as for the first path A and the second path B, the difference between the optical path lengths of two paths can also be further adjusted by adjusting the thickness of the light emitting structure layer 3 in the first path A.

For the path second B and the third path C, the substrate 1, the encapsulating substrate 72, and the second electrode layer 4 are made of the same material and have the same thickness, and need not be considered. The main difference between the second path B and the third path C is that the second path B includes the connecting portion 212, and the thickness of the first pixel defining layer 5 in the third path C is different from the thickness of the first pixel defining layer 5 in the path B. Therefore, the thickness or the refractive index of the connecting portion 212 can be adjusted to make the difference between the optical path length of the path B and the optical path length of the path C be an integer multiple of the wavelength. The thickness and/or the refractive index of the first pixel defining layer 5 can also be adjusted, so that the external incident light passes through the path B and the path C to obtain the difference between the optical path lengths, and the difference therebetween is an integer multiple of the wavelength of the external incident light.

For the first path A and the third path C, the substrate 1, the encapsulating substrate 72, and the second electrode layer 4 are made of the same material and have the same thickness, and need not be considered. The main difference between the first path A and the third path C is that the first path A includes the first electrode block 211 and the light emitting structure layer 3, and the path C includes the first pixel defining layer 5. Therefore, the thickness and/or the refractive index of the first electrode block 211 can be adjusted to make the difference between the optical path length of the path A and the optical path length of the path C be an integer multiple of the wavelength. The thickness and/or the refractive index of the first pixel defining layer 5 can also be adjusted, so that the external incident light passes through the path A and the path C to obtain the difference between the optical path lengths, and the difference therebetween is an integer multiple of the wavelength of the external incident light. Alternatively, the thickness and/or the refractive index of the first electrode block 211 and the thickness and/or the refractive index of the first pixel defining layer 5 can both be adjusted, so that the external incident light passes through the path A and the path C to obtain the difference between the optical path lengths, and the difference therebetween is an integer multiple of the wavelength of the external incident light.

When the transparent display panel 100 is a flexible panel, the transparent display panel 100 can be encapsulated by a film. That is, a film encapsulating layer is formed on the second electrode layer 4. In this case, the substrate 1 can be a flexible substrate. Material of the flexible substrate can be one or more selected from the group consisted of PEN (polyethylene naphthalate), PET (polyethylene terephthalate), PI (polyimide), PES (polyethersulfone resin), PC (polycarbonate), and PEI (polyetherimide).

The film encapsulating layer can include an inorganic material encapsulating layer and an organic material encapsulating layer. The inorganic material encapsulating layer is disposed on an entire surface and has a uniform thickness, so it has no effect on the difference between the optical path lengths of the paths. The organic material encapsulating layer fills the first pixel opening. After the first pixel opening is full of the organic material encapsulating layer, an encapsulating layer of an entire layer is formed. Therefore, in different paths, the thickness of the organic material encapsulating layer is different. Accordingly, the optical path length of the light passing through the path can be adjusted by adjusting the thickness of the organic material encapsulating layer in the first pixel opening, or by adjusting the refractive index of the organic material encapsulating layer, or by adjusting both the thickness and the refractive index of the organic material encapsulating layer, or by combining other adjusting manners. The thickness of the organic material encapsulating layer passed through by the first path A is greater than the thickness of the organic material encapsulating layer passed through by other paths.

In an embodiment, the transparent display panel 100 can be an AMOLED display panel. The transparent display panel 100 can further include a driving circuit layer disposed between the substrate 1 and the first electrode layer 2. The driving circuit layer is provided with a pixel circuit that drives a pixel. Specifically, the pixel circuit can include one or more switching devices, capacitors and the like. The switching devices can be connected with each other in series or in parallel as required, to form the pixel circuit such as a 2T1C circuit, or a 3T1C circuit, or a 3T2C circuit, or a 7T1C circuit, or a 7T2C circuit.

The switching device can be a thin film transistor TFT. The thin film transistor can be an oxide thin film transistor or a low temperature polysilicon thin film transistor (LTPS TFT). The thin film transistor can be an indium gallium zinc oxide thin film transistor (IGZO TFT). Alternatively, the switching device can also be a Metal-Oxide-Semiconductor Field-Effect Transistor (MOSFET), or any other element with switching characteristics in the prior art, such as an insulated gate bipolar transistor (IGBT), or the like, as long as the electronic element that can realize the switching function of this embodiment and can be integrated into the display panel, the electronic element will fall within the protection scope of the present application.

Since the pixel driving circuit includes a variety of devices, a multi-layered film layer structure, including a source, a drain, a gate, a gate insulating layer, an active layer, an interlayer insulating layer and the like, is also formed. Each film layer forms a patterned film layer structure. In different paths, the paths through which the light passes will be different. Therefore, the optical path length of the light passing through the path can be adjusted by adjusting the thickness or the refractive index of each layer in the layer of the pixel driving circuit.

In an embodiment, the first electrode group 20 can include two first electrodes 21. Each of the first electrodes 21 corresponds to one pixel circuit. In such an arrangement, the transparent display panel 100 is divided into two display areas. The brightness in each display area can be individually adjusted by the pixel circuit corresponding to the first electrode 21 in this display area, thereby increasing the flexibility of the adjustment.

In another embodiment, the first electrode group 20 can include one first electrode 21. The driving mode of the first electrode 21 can be a passive matrix (PM) drive or an active matrix (AM) drive. When the driving mode of the first electrode 21 is the AM drive, the first electrode 21 corresponds to one pixel circuit, and the pixel circuit is connected to one end of the first electrode 21. Alternatively, the first electrode 21 corresponds to two pixel circuits, and the two pixel circuits are electrically connected to both ends of the first electrode respectively. Optionally, the first electrode 21 corresponds to two pixel circuits, and a data signal can be input through two ends of the first electrode 21, which is more beneficial to reduction of signal delay.

Figure 9:
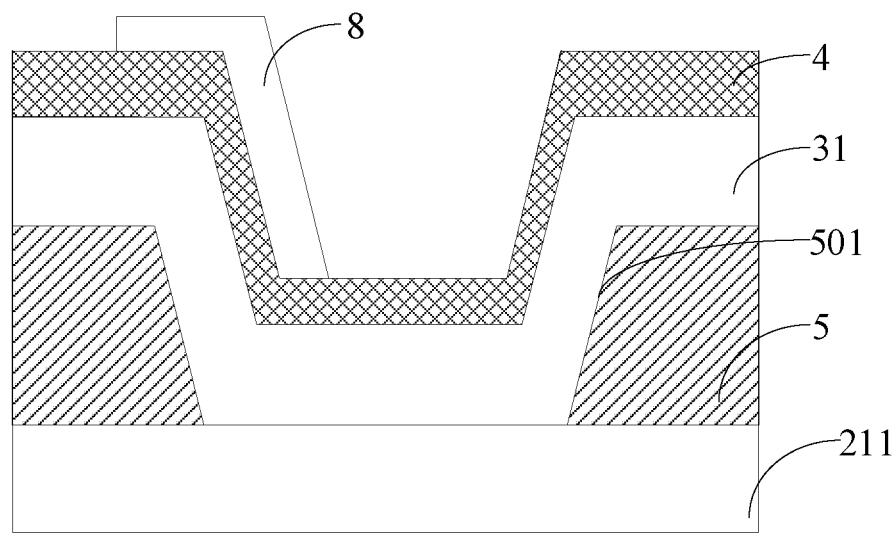
FIG. 9 is a partial cross-sectional view illustrating the transparent display panel according to an embodiment of the present application.

In an embodiment, referring to FIG. 9, a side wall of the first pixel opening 501 on the first pixel defining layer 5 extends obliquely from bottom to top (that is, an included angle between the side wall of the first pixel opening 501 and a bottom of the first pixel opening is an obtuse angle).

The transparent display panel 100 can further include a third electrode layer 8. The third electrode layer 8 is disposed at least on the side wall of the first pixel opening 501. The third electrode layer 8 is in direct contact with the second electrode layer 4.

In an embodiment, the third electrode layer 8 can be disposed on an upper surface or a lower surface of the second electrode layer 4, so as to directly touch the second electrode layer 4. FIG. 9 illustrates the embodiment by only taking the third electrode layer 8 disposed on the upper surface of the second electrode layer 4 as an example. The embodiment in which the third electrode layer 8 is disposed on the lower surface of the second electrode layer 4 is not illustrated.

Since the second electrode layer 4 is disposed on the entire surface, when a thin material (such as Mg and Ag) with low work function is used to manufacture the second electrode layer 4, a portion of the second electrode layer 4, which is located on the side wall of the first pixel opening 501, is relatively thin, thus resulting in that the portion of the second electrode layer 4, which is located on the side wall of the first pixel opening 501, has a relatively large resistance. Along with an extension of a use time of the transparent display panel 100, this portion of the second electrode layer 4 will be degraded. In severe cases, this portion of the second electrode layer 4 will break, which in turn disables the light emitting structure block 31 in the first pixel opening 501 to emit light normally. By disposing the third electrode layer 8 in direct contact with the second electrode layer 4 on the side wall of the first pixel opening 501, a thickness of a metal layer on the side wall of the first pixel opening 501 increases, thereby reducing problems that the resistance of this portion of the second electrode layer 4 is relatively large due to the smaller thickness of the second electrode layer 4 located on the side wall of the first pixel opening 501. Moreover, even if the second electrode layer 4 located on the side wall of the first pixel opening 501 is broken, the third electrode layer 8 can play a role of a connection, and a current can flow through the third electrode layer 8 to ensure that the light emitting structure block 31 in the first pixel opening 501 normally emits light.

In an embodiment, the third electrode layer 8 is evaporated by means of a mask plate. An evaporating opening is aligned with the side wall of the first pixel opening 501, so that the evaporated third electrode layer 8 is formed on the side wall of the first pixel opening. However, considering an alignment error of the evaporating opening of the mask plate, a horizontal size of the opening of the mask plate used for evaporating the third electrode layer 8 is generally configured to be slightly larger than a maximum distance in the horizontal direction of the third electrode layer formed on the side wall, so as to ensure that the third electrode layer 8 is formed on the side wall of the first pixel opening 501, even if the alignment of the opening of the mask plate is deviated when the third electrode layer 8 is evaporated.

When the horizontal size of the evaporating opening of the mask plate in the horizontal direction is greater than the horizontal maximum distance of the third electrode layer 8 formed on the side wall, the third electrode layer 8 formed by evaporation will have following three cases.

In a first case, in addition to being disposed on the side wall of the first pixel opening 501, the third electrode layer 8 is also extended to and disposed on a top edge of the first pixel defining layer 5 adjacent to the side wall of the first pixel opening 501.

In a second case, in addition to being disposed on the side wall of the first pixel opening 501, the third electrode layer 8 is also extended to and disposed on a bottom of the first pixel opening 501.

In a third case, in addition to being disposed on the side wall of the first pixel opening 501, the third electrode layer 8 is also extended to and disposed on the bottom of the first pixel opening 501, and is extended to and disposed on the top edge of the first pixel defining layer 5 adjacent to the side wall of the first pixel opening 501.

Embodiments of the present application also provide a display screen, which includes a first display area and a second display area. A light transmittance of the first display area is greater than a light transmittance of the second display area. A photosensitive device is arranged under the first display area. The first display area is provided with a first electrode layer, a first pixel defining layer disposed on the first electrode layer and provided with a first pixel opening, a light emitting structure block disposed inside the first pixel opening, and a second electrode layer. The second electrode layer is a surface electrode. The second electrode layer is disposed on the first pixel defining layer, and is partially disposed on a side wall of the first pixel opening.

A third electrode layer is disposed in the first display area. The third electrode layer is disposed at least on the side wall of the first pixel opening and in direct contact with the second electrode layer.

By arranging the third electrode layer to be in a direct contact with the second electrode layer on the side wall of the first pixel opening, a thickness of a metal layer on the side wall of the first pixel opening can be increased, thereby reducing problems that a resistance of a portion of the second electrode layer disposed on the side wall of the first pixel opening is relatively large due to the smaller thickness of this portion of the second electrode layer. Moreover, even if the second electrode layer disposed on the side wall of the first pixel opening is broken, the third electrode layer can play a role of a connection, and a current can flow through the third electrode layer to ensure that the light emitting structure block in the first pixel opening normally emits light.

Optionally, the third electrode layer is disposed on an upper surface or a lower surface of the second electrode layer.

Optionally, the third electrode layer extends to be disposed on a top edge of the first pixel defining layer adjacent to the side wall of the first pixel opening.

Optionally, the third electrode layer extends to be disposed on a bottom of the first pixel opening.

Optionally, the second display area is provided with a fourth electrode layer, a second pixel defining layer disposed on the fourth electrode layer and provided with a second pixel opening, a light emitting structure block provided inside the second pixel opening, and a fifth electrode layer disposed on the second pixel defining layer. The fifth electrode layer is a surface electrode. A thickness of the fifth electrode layer is greater than a thickness of the second electrode layer. Such an arrangement can ensure a larger light transmittance of the first display area, so that the photosensitive device disposed under the first display area can receive more light.

A material of the second electrode layer includes at least one of indium tin oxide, indium zinc oxide, Mg and Ag.

Optionally, the material of the second electrode layer includes Mg and Ag. A ratio of a mass of Mg to a mass of Ag can be in a range from 1:4 to 1:20.

The first pixel defining layer and the second pixel defining layer can be the same film layer structure. The light emitting structure block in the first display area and the light emitting structure block in the second display area can be formed in the same process step.

The first display area can be a transparent display area. The transparent display panel disposed in the first display area can have the same structure as the transparent display panel 100 described above. For details, please refer to the aforementioned embodiments, and description thereof will not be repeated herein. The light transmittance of the first display area is greater than the light transmittance of the second display area.

Embodiments of the present application further provide a mask plate, which is used in a manufacturing process of a display screen. The display screen includes a first display area and a second display area. A light transmittance of the first display area is greater than a light transmittance of the second display area. A photosensitive device can be disposed under the first display area. The first display area is provided with a first electrode layer, a first pixel defining layer disposed on the first electrode layer and provided with a plurality of first pixel openings, a light emitting structure block provided inside the first pixel openings, a second electrode layer, and a third electrode layer. The second electrode layer is a surface electrode. The second electrode layer is disposed on the first pixel defining layer, and is partially disposed on a side wall of the first pixel opening. The third electrode layer is disposed at least on the side wall of the first pixel opening. The third electrode layer is in direct contact with the second electrode layer. The second display area is provided with a fourth electrode layer, a second pixel defining layer disposed on the fourth electrode layer and provided with a second pixel opening, a light emitting structure block disposed inside the second pixel opening, and a fifth electrode layer disposed on the second pixel defining layer. The fifth electrode layer is a surface electrode. A thickness of the fifth electrode layer is greater than a thickness of the second electrode layer.

Figure 10:
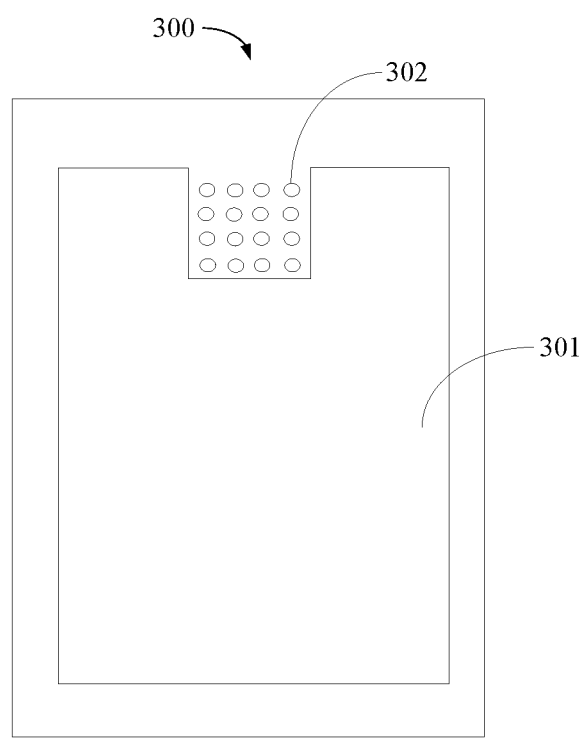
FIG. 10 is a top view illustrating a mask plate according to an embodiment of the present application.

Referring to FIG. 10, the mask plate 300 includes a first opening 301 and a plurality of second openings 302. The first opening 301 is used to manufacture the fifth electrode layer. The second openings 302 are used to manufacture the third electrode layer. A shape of the first opening 301 is consistent with a shape of the second display area. A size of the second opening 302 is much smaller than a size of the first opening 301.

During manufacture of the display screen, when the above mask plate 300 is used, the first opening 301 is aligned with the second display area. The fifth electrode layer of the second display area is manufactured through the first opening 301. The second opening 302 is aligned with the side wall of the first pixel defining layer of the first display area. The third electrode layer of the first display area is manufactured through the second opening 302. The fifth electrode layer of the second display area and the third electrode layer of the first display area can be manufactured at the same time by using the mask plate 300 above, thereby simplifying the manufacturing process of the display screen.

Figure 11:
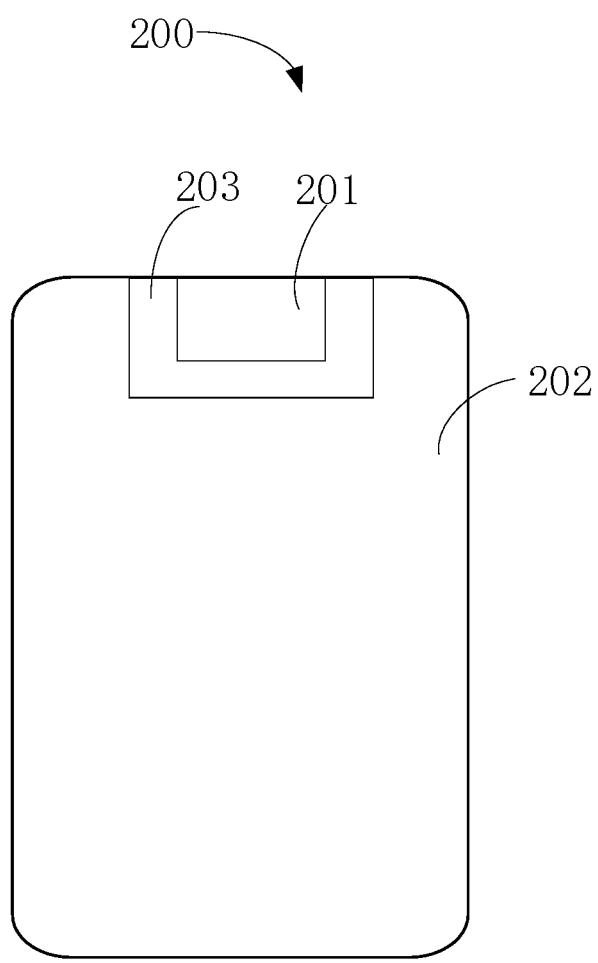
FIG. 11 is a top view illustrating a display screen according to an embodiment of the present application.

The present application further provides a display screen. Referring to FIG. 11, the display screen 200 includes a first display area 201 and a second display area 202. The first display area 201 is provided with the transparent display panel 100 described in the above embodiments. A light transmittance of the first display area 201 is greater than a light transmittance of the second display area 202. A photosensitive device can be disposed under the first display area 201.

Since a display panel provided in the first display area 201 of the display screen 200 can be the transparent display panel 100 described in the above embodiments, the complexity of wirings in the first display area 201 can be reduced, thereby effectively improving a diffraction superposition phenomenon caused by the complex wirings in the first display area 201 during light transmission, improving the quality of the images captured by a camera disposed on a backlight surface of the first display area 201, and avoiding the defects of image distortions defects. In addition, a plurality of first electrode blocks 211 of the same first electrode 21 are electrically connected with each other, such that the light emitting structure blocks correspondingly disposed on the plurality of first electrode blocks 211 of the same first electrode 21 can be controlled to emit light or to be turned off simultaneously, thereby simplifying the control for the first display area 201.

In an embodiment, referring to FIG. 11, the display screen 200 further includes a transitional display area 203 adjacent to the first display area 201 and the second display area 202. The first display area 201 is at least partially surrounded by the transitional display area 203. A pixel circuit corresponding to the first electrode 21 of the first display area 201 is disposed in the transitional display area 203.

Such an arrangement can further simplify the complexity of the film layer structure of the first display area 201 and the complexity of the wirings, and is more beneficial to improvement of the diffraction superposition phenomenon generated during light transmission, thereby further improving the quality of the images captured by the camera disposed on the backlight surface of the first display area 201.

In an embodiment, the second display area 202 and the transitional display area 203 are provided with a fourth electrode layer, a light emitting structure layer disposed on the fourth electrode layer, and a fifth electrode layer disposed on the light emitting structure layer. The fifth electrode layer includes a plurality of fifth electrode blocks arranged at intervals. The arrangement of the fifth electrode blocks can be the same as that of the first electrode blocks in the first display area 201, so that display effects of the first display area 201, the second display area 202 and the transitional display area 203 are more consistent.

In an embodiment, a density of sub-pixels in the transitional display area 203 is less than a density of sub-pixels in the second display area 202, and is greater than a density of sub-pixels in the first display area 201. In this case, when the display screen 200 displays, a brightness of the transitional display area 203 is between a brightness of the first display area 201 and a brightness of the second display area 202, thereby avoiding an obvious boundary caused by larger brightness differences when the first display area 201 and the second display area 202 are adjacent, and improving user's experience.

Further, a distance between adjacent sub-pixels in the transitional display area 203 is smaller than a distance between adjacent sub-pixels in the first display area 201; and/or, a size of each of the sub-pixels in the transitional display area 203 is smaller than a size of each of the sub-pixels in the first display area 201. By means of these two configurations, the density of the sub-pixels in the transitional display area 203 is greater than the density of the sub-pixels in the first display area 201.

Embodiments of the present application further provide a display device, which includes a device body and the display screen described in any one of the aforementioned embodiments. The device body has a device area. The display screen covers the device body. The device area is located below the first display area, and provided with a photosensitive device collecting light through the first display area.

The photosensitive device can include a camera and/or a light sensor. Other devices other than the photosensitive device, such as a gyroscope or an earpiece, and the like, can also be disposed in the device area. The device area can be a notched area. The first display area of the display screen can be disposed corresponding to the notched area and be attached to the notched area, so that the photosensitive device can emit or collect light through the first display area.

Since the first display area of the above display device is the transparent display panel described in the aforementioned embodiments, the complexity of the wirings in the first display area can be reduced, thereby effectively improving a diffraction superposition phenomenon caused by the complex wirings in the first display area during light transmission, improving the quality of the images captured by a camera disposed on a backlight surface of the first display area, and avoiding defects of image distortions. In addition, a plurality of first electrode blocks of the same first electrode are electrically connected with each other, so that the light emitting structure blocks correspondingly disposed on the plurality of first electrode blocks of the same first electrode can be controlled to emit light or to be turned off simultaneously, thereby simplifying the control for the first display area.

The aforementioned display device can be a digital device such as a mobile phone, a tablet, a palm computer, an iPod, or the like.

It should be noted that in the accompanying drawings, dimensions of layers and areas may be exaggerated for clarity of illustration. It can be understood that when an element or a layer is referred to as being "on" another element or layer, it can be directly on the other element or intermediate layers may be present. In addition, it can be understood that when an element or layer is referred to as being "under" another element or layer, it can be directly under the other element, or more than one intermediate layer or element may be present. In addition, it can also be understood that when a layer or element is referred to as being "between" two layers or two elements, it can be the only layer between the two layers or two elements, or more than one intermediate layers or elements may also be present. The same reference numeral indicates the same element.

In the present disclosure, the terms "first" and "second" are only used for descriptive purposes, and cannot be understood as indicating or implying relative importance. The term "plurality" refers to two or more, unless specifically defined otherwise.

Those skilled in the art can easily think of other embodiments of the present disclosure after considering the specification and implementing the solutions disclosed herein. The present disclosure is intended to cover any variations, purposes, or adaptive changes of the present disclosure. These variations, purposes, or adaptive changes follow general principles of the present disclosure and include common knowledge or conventional technical means in the technical field which are not disclosed by the present disclosure. The specification and embodiments are merely illustrative, and the true scope of the present disclosure is claimed by the following claims.

It should be understood that the present disclosure is not limited to the precise structure described above and shown in the accompanying drawings, and various modifications and changes can be made without departing from the scope of the present disclosure. The scope of the present disclosure is limited only by the appended claims.

What is claimed is:

1. A transparent display panel, comprising:
   a substrate;
   a first electrode layer, disposed on the substrate, comprising a plurality of first electrode groups arranged along a first direction, each of the first electrode groups comprising at least one first electrode extending along a second direction intersecting the first direction, each of the at least one first electrode comprising at least two first electrode blocks and at least one connecting portion, two adjacent first electrode blocks being electrically connected with each other by a corresponding connecting portion;
   a light emitting structure layer, disposed on the first electrode layer; and
   a second electrode layer, disposed on the light emitting structure layer.

2. The transparent display panel according to claim 1, wherein the at least two first electrode blocks and the at least one connecting portion of each of the first electrode groups are provided on a same layer; and
   wherein a size of the connecting portion, in a direction perpendicular to an extending direction of the connecting portion, is greater than 3 µm and smaller than a half of a maximum size of the first electrode block.

3. The transparent display panel according to claim 2, wherein a projection of the first electrode block on the substrate comprises a first pattern unit, or a plurality of first pattern units connected with each other,
   and the first pattern unit comprises circular, elliptical, dumbbell-shape, gourd-shaped, or rectangular.

4. The transparent display panel according to claim 3, wherein the light emitting structure layer comprises a light emitting structure block correspondingly disposed on each of the at least two first electrode block, a projection of the light emitting structure block on the substrate comprises a second pattern unit or a plurality of second pattern units connected with each other, the second pattern unit is identical to or different from the first pattern unit,
   the first electrode layer is an anode layer, the second electrode layer is a cathode layer, the second electrode layer is a surface electrode, materials of the first electrode layer and/or the second electrode layer are transparent materials; and
   a light transmittance of the transparent material is greater than or equal to 70%.

5. The transparent display panel according to claim 1, having a plurality of euphotic paths, wherein:
   each path passes through different film layers; and
   external incident light enters into the transparent display panel in a direction perpendicular to a surface of the substrate, and when a thickness of each of the film layers is set to be a preset thickness, and/or when a refractive index of each of the film layers is set to be a preset refractive index, the external incident light passes through the transparent display panel along two of the multiple paths to obtain a difference between optical path lengths of the two paths, and the difference between the two paths is an integer multiple of a wavelength of the external incident light.

6. The transparent display panel according to claim 5, wherein the difference between the optical path lengths of the two paths is zero.

7. The transparent display panel according to claim 5, further comprising a first pixel defining layer disposed between the first electrode layer and the second electrode layer, and an encapsulating layer disposed on the second electrode layer,
   the first pixel defining layer is provided with a plurality of first pixel openings,
   the light emitting structure layer comprises a plurality of light emitting structure blocks, and
   the plurality of light emitting structure blocks are disposed in the plurality of first pixel openings and in a one-to-one correspondence with the plurality of first pixel openings.

8. The transparent display panel according to claim 7, wherein the at least two first electrode blocks and the at least one connecting portion of each of the first electrode groups are provided on a same layer, the plurality of paths comprise a first path, a second path, and a third path,
   the first path passes through the encapsulating layer, the second electrode layer, the light emitting structure layer, the first electrode layer, and the substrate,
   the second path passes through the encapsulating layer, the second electrode layer, the first pixel defining layer, the connecting portion, and the substrate, and
   the third path passes through the encapsulating layer, the second electrode layer, the first pixel defining layer, and the substrate.

9. The transparent display panel according to claim 8, wherein the transparent display panel is a flexible screen encapsulated by a film,
   the encapsulating layer comprises a film encapsulating layer, the film encapsulating layer comprises an organic material encapsulating layer, and
   a thickness of the organic material encapsulating layer passed through by the first path is greater than a thickness of the organic material encapsulating layer passed through by the second paths or the third paths.

10. The transparent display panel according to claim 8, wherein the transparent display panel is a hard screen encapsulated by glass frit,
    the encapsulating layer comprises a vacuum gap layer and a glass cover plate, a thickness of the vacuum gap layer passed through by the first path is greater than a thickness of the vacuum gap layer passed through by the second path or the third path.

11. The transparent display panel according to claim 1, wherein:
the first direction is perpendicular to the second direction, the first direction is a row direction or a column direction,
in the second direction, in the at least two first electrode blocks of the same first electrode group, two projections of two adjacent first electrode blocks on a plane perpendicular to the second direction are offset;
the first electrode comprises at least three first electrode blocks; and
in the first electrode blocks of the same first electrode, two projections of two first electrode blocks located at two sides of any one of the at least three first electrode blocks on a plane perpendicular to the second direction are overlapped completely.

12. The transparent display panel according to claim 1, wherein the first electrode group comprises two first electrodes,
the first electrode has an active matrix (AM) driving mode, and each first electrode corresponds to one pixel circuit.

13. The transparent display panel according to claim 1, wherein the first electrode group comprises one first electrode and corresponds to one pixel circuit, or
the first electrode corresponds to two pixel circuits, and the two pixel circuits are electrically connected to two ends of the first electrode.

14. The transparent display panel according to claim 1, further comprising a first pixel defining layer disposed between the first electrode layer and the second electrode layer and a third electrode layer, wherein:
the first pixel defining layer is provided with a plurality of first pixel openings, the light emitting structure layer comprises a plurality of light emitting structure blocks, the plurality of light emitting structure blocks are disposed in the plurality of first pixel openings in a one-to-one correspondence,
the third electrode layer is disposed at least on a side wall of the first pixel opening and in direct contact with the second electrode layer, and
the third electrode layer is disposed on an upper surface or a lower surface of the second electrode layer.

15. The transparent display panel according to claim 14, wherein the third electrode layer extends to be disposed on a top edge of the first pixel defining layer adjacent to the side wall of the first pixel opening.

16. The transparent display panel according to claim 14, wherein the third electrode layer extends to be disposed on a bottom of the first pixel opening.

17. A display screen, comprising:
a first display area provided with the transparent display panel according to claim 1; and
a second display area;
wherein a light transmittance of the first display area is greater than a light transmittance of the second display area and a photosensitive device is disposed under the first display area.

18. The display screen according to claim 17, further comprising a transitional display area adjacent to the first display area and the second display area, the first display area is at least partially surrounded by the transitional display area, a pixel circuit corresponding to the first electrode of the first display area is disposed in the transitional display area, and
a density of sub-pixels in the transitional display area is less than a density of sub-pixels in the second display area, and greater than a density of sub-pixels in the first display area.

19. The display screen according to claim 17, wherein a first pixel defining layer provided with first pixel openings is disposed on the first electrode layer; light emitting structure blocks are disposed in the first pixel openings, the second electrode layer is a surface electrode, the second electrode layer is disposed on the first pixel defining layer and is partially disposed on side walls of the first pixel openings;
the first display area is further provided with a third electrode layer; the third electrode layer is disposed on an upper surface or a lower surface of the second electrode layer, and the third electrode layer is in direct contact with the second electrode layer; and
the second display area is further provided with a fourth electrode layer, a second pixel defining layer disposed on the fourth electrode layer and provided with a second pixel opening, a light emitting structure block provided in the second pixel opening, and a fifth electrode layer disposed on the second pixel defining layer, the fifth electrode layer is a surface electrode, and a thickness of the fifth electrode layer is greater than a thickness of the second electrode layer.

20. A mask plate, used in a manufacturing process of the display screen according to claim 17, wherein a first pixel defining layer provided with first pixel openings is disposed on the first electrode layer, the light emitting structure blocks are disposed in the first pixel openings, the second electrode layer is a surface electrode, and the second electrode layer is disposed on the first pixel defining layer and is partially disposed on side walls of the first pixel openings;
the first display area is further provided with a third electrode layer, the third electrode layer is disposed on an upper surface or a lower surface of the second electrode layer, and the third electrode layer is in direct contact with the second electrode layer;
the second display area is further provided with a fourth electrode layer, a second pixel defining layer disposed on the fourth electrode layer and provided with a second pixel opening, a light emitting structure block provided in the second pixel opening, and a fifth electrode layer disposed on the second pixel defining layer, the fifth electrode layer is a surface electrode, and a thickness of the fifth electrode layer is greater than a thickness of the second electrode layer; and
the mask plate comprises a first opening configured to manufacture the fifth electrode layer, and a plurality of second openings configured to manufacture the third electrode layer.

* * * * *